United States Patent

Lee et al.

[11] Patent Number: 6,051,483
[45] Date of Patent: Apr. 18, 2000

[54] FORMATION OF ULTRA-SHALLOW SEMICONDUCTOR JUNCTION USING MICROWAVE ANNEALING

[75] Inventors: Kam Leung Lee, Putnam Valley; David Andrew Lewis, Carmel; Raman Gobichettipalayam Viswanathan, Briarcliff Manor, all of N.Y.

[73] Assignee: International Business Machines Corporation, Armonk, N.Y.

[21] Appl. No.: 08/868,770

[22] Filed: Jun. 4, 1997

Related U.S. Application Data

[60] Provisional application No. 60/030,500, Nov. 12, 1996.

[51] Int. Cl.[7] .............................. H01L 21/26; H01L 21/42
[52] U.S. Cl. ......................... 438/530; 438/799; 438/772; 438/686; 438/762
[58] Field of Search .................................... 438/799, 530, 438/772, 686; 219/686, 762

[56] References Cited

U.S. PATENT DOCUMENTS

| | | | |
|---|---|---|---|
| 4,190,467 | 2/1980 | Lien et al. | 117/40 |
| 4,303,455 | 12/1981 | Splinter et al. | 438/560 |
| 4,436,557 | 3/1984 | Wood et al. | 438/89 |
| 4,474,625 | 10/1984 | Cohen et al. | 438/799 |
| 4,490,183 | 12/1984 | Scovell | 438/772 |
| 4,617,066 | 10/1986 | Vasudev | 438/515 |
| 5,168,348 | 12/1992 | Chu et al. | 257/713 |
| 5,219,786 | 6/1993 | Noguchi | 438/799 |
| 5,270,226 | 12/1993 | Hori et al. | 438/302 |
| 5,380,702 | 1/1995 | Henty et al. | 505/480 |
| 5,624,859 | 4/1997 | Liu et al. | 438/298 |

OTHER PUBLICATIONS

S. Wolf and R.N. Tauber, eds "Silicon Processinf for the VLSI Era Volume 1–Process Technology." Lattice Press, Sunset Beach CA. pp. 58, and 308, 1986.

*Primary Examiner*—Charles Bowers
*Assistant Examiner*—Craig Thompson
*Attorney, Agent, or Firm*—Thomas A Beck

[57] ABSTRACT

The present invention is a method of utilizing microwave energy for annealing of ion implanted wafers. By controlling the time, power density and temperature regime, it is possible to substantially fully anneal the wafer while limiting (and substantially preventing) the diffusion of dopant into the silicon, thereby producing higher performance scaled semiconductor devices. It is also possible, using different conditions, to allow and control the dopant profile (diffusion) into the silicon. Another aspect of the present invention is a method of forming a PN junction in a semiconductor wafer having a profile depth less than about 50 nm and a profile wherein the net doping concentration at said PN junction changes by greater than about one order of magnitude over 6 nm wherein the surface concentration of said dopant is greater than about $1\times10^{20}/cm^3$. The method includes providing a semiconductor wafer which can be single crystal or amorphous surface; implanting into said surface a dopant; exposing the surface to an energy source; the energy source being applied to supply energy at a rate such that the surface is substantially fully annealed before the dopant diffuses greater than about 50 nm. Another aspect of the present invention is having a PN junction formed between a first material of a first conductivity type and a second material of a second conductivity type, the junction has a depth of less than about 50 nm, in the first material the net doping concentration at the junction changes by greater than about one order of magnitude over 10 nm, the maximum value of said first conducting material of said wafer has a surface concentration of greater than about $1\times10^{20}/cm^3$.

26 Claims, 10 Drawing Sheets

ORIGINAL DEVICE

SCALED DEVICE

0 → 5mm FROM BEAM CENTER

TEM. MICROGRAPH

> 5mm FROM BEAM CENTER

TEM. MICROGRAPH

FORMATION OF ULTRA-SHALLOW SEMICONDUCTOR JUNCTION USING MICROWAVE ANNEALING

This application claims priority from Provisional Application Ser. No. 60/030,500 which was filed on Nov. 12, 1996.

FIELD OF INVENTION

The present invention is directed to a method of forming very shallow and abrupt junctions having high surface concentrations of dopants in electronic devices using microwave annealing.

BACKGROUND

Advances in the miniaturization of CMOS devices have been the key driving force behind the explosive growth of various network centric computing products such as ASIC high speed microprocessors and memories, low power handheld computing devices, cable modems and advance multimedia audio and video devices. Smaller CMOS devices also means faster switching times for speedier, better-performing end-user systems.

The process of miniaturization of CMOS device technology involves scaling down of various horizontal and vertical dimensions in the CMOS transistor device structure (see FIG. 1). In particular, the thickness of the ion implanted source/drain junctions of the P or N transistors are scaled down with a corresponding scaled increase in the substrate channel doping. In this manner, constant electric field is maintained in the transistor channel which results in higher speed performance for the scaled down CMOS transistors. As shown in FIG. 1(b), schematically shows a CMOS device according to the present invention for a 0.1 μm CMOS devices, the source/drain ion-implanted junctions are as shallow as 50 nm and with a channel doping concentration as high as 1E18 /cm$^3$.

For CMOS devices with critical gate dimension below 0.25 μm, shallow junction is not the only requirement. The more important requirement in the Source/ Drain implant shallow junction is the abruptness of the junction dopant profile slope which is in close proximity to the transistor channel. As shown in FIG. 2(a), there is more penetration of source/drain dopant into the transistor channel as the junction profile slope becomes less abrupt. This results in poor $V_t$ threshold voltage roll-off characteristics for subquarter micron CMOS devices. (see for example FIG. 2(b)) Thus for small advanced CMOS devices, it is vital for the source/drain junction profile to be shallow abrupt and with high surface concentration i.e. junction depth below 50 nm, profile abruptness at channel doping concentration of 1E18 /cm$^3$ is preferably less than 10 nm per order of magnitude change in dopant concentration (more preferably 6 nm per order of magnitude) with the junction surface concentration higher than 1E20 /cm$^3$.

The formation of source/drain junctions in CMOS devices are commonly done by ion implantation in appropriately masked source/drain regions of silicons with boron (p-type) or arsenic and phosphorous (N-type) dopants. To minimize ion channelling during the ion implantation which will broaden the as-implanted profile, the silicon substrate is usually pre-amorphized with heavy ions such as Ge or Si. Although the preamorphization process helps to sharpen the as-implanted profile and improves the epitaxial silicon regrowth process during subsequent thermal annealing, it also creates extensive crystal damage and excess Si interstitials at the end of range (EOR) of the pre-amorphized ions. During thermal annealing, the presence of these EOR damages and excess Si interstitials greatly enhance (10 to 1000 times) the diffusion of dopants through the Si substrates and results in much deeper S/D (source/drain) junctions and poorer junction profiles. The relatively high diffusivity of small Boron dopants in combination with ion channelling and transient diffusion makes the fabrication of small CMOS p$^+$ junction particularly difficult and becomes the major hurdle to be overcome for further miniaturization of the CMOS device technology.

There are three basic time regimes for an annealing process such as this—The first is "Adiabatic" annealing, in which the surface is heated to very high temperatures in a very short time, typically less than 100 ns, substantially preventing thermal transport into the material and thereby developing an extremely high temperature on the surface of the silicon (close to or above melting). Some defects can arise from the rapid cooling of the silicon. This form of adiatbatic heating requires localized application of high power pulsed excimer laser radiation and results in the melting and recrystallization of the top thin layer of implanted wafer.

The second regime, "Thermal flux", operates on a time scale of about 1 ms. In this mode, a strong thermal gradient is established through the thickness of the wafer. This can be achieved by rapidly raster scanning a CW laser or high power electron beams across the top surface of the wafers. It is desirable to anneal the entire wafer to prevent lateral thermal diffusion of the dopant at the edge of a single pass and the formation of stress between adjacent regions of the wafer. The total joule energy necessary for this is large, due to convection and black-body (infra-red) losses during the processing. Unfortunately, there is no currently known method for accomplishing this. It is this time regime that the current invention addresses.

The third regime is considered "isothermal", with a time scale of 1 second or more. In this time regime, the thermal energy can be efficiently transported throughout the thickness of the wafer, producing a substantially uniform temperature profile across the thickness of the wafer, and is substantially independent of the method of heating, since thermal conduction dominates. This mode is widely used today in manufacturing processes and is commonly achieved by the illumination of the wafers with bank of high power tungsten halogen lamps.

In early transistor junction formation, the annealing process was performed in a conventional furnace. In this type of process, wafers are kept for long times (few hours or more) at temperatures below the optimum process temperatures. However, it was realized that to limit the dopant diffusion and improve defect anneal characteristics during annealing, it is necessary to reduce the time for a given temperature anneal. Recent developments have led to the process known as Rapid Thermal Annealing (RTA). In this process, regardless of the method of applying heat, the process utilizes a heating ramp (over about a minute) to 1050° C., with a 5 to 30 second hold time and a rapid cooling time.

During this annealing, silicon and dopant atoms are moved to substitutional sites in the crystalline Si lattice, other defects are removed and there is an inadvertent and undesirable diffusion of dopant atoms deeper into the silicon material, driven by the concentration profile of the dopant. The motion of the atoms, both desirable and undesirable have an associated activation energy and the critical control elements are the time and temperature.

There are two known examples of using microwave energy for wafer annealing: European patent application PCT/SE94/00190 to Buchta et al, "Cold Wall Reactor For Heating of Silicon Wafers by Microwave energy" and in a paper "Rapid Thermal Processing with Microwave heating", by S. L. Zhang, R. Buchta and D. Sigurd, Thin Solid Film, V246, p151–157 (1994) uses a microwave generator operating at about 2.45 GHz with a power level of about 1500 W to heat wafers (5" wafers) to about 1050)° C. over a period of about 30 seconds or more. Dopant profiles after microwave anneal were not discussed in these publications, although they are expected to be consistent with other rapid thermal anneal (RTA) processing using technology known to the art, since the time-temperature parameters are identical with other RTA processing techniques. There is no teaching in the paper or patent to the formation of dopant concentrations or profiles as taught herein. According to the present invention the substrate is exposed to microwave radiation for less than 1 second.

In another example, very intense microwave radiation was used in a pulse mode, in which a wafer was exposed to a series of pulses of microwave energy, with total power of up to 8 MW. Power density at the wafer surface was about 240 kW/$cm^2$. and the microwave pulse duration was around 1.1 $\mu$s. For the annealing process, up to 2000 pulses were used for a single wafer. Reported results indicate that there was substantial surface damage and melting of the wafer surface. Additionally, the dopant moved a substantial distance into the silicon—up to 300 $\mu$m (microns). In contrast, the method of the present invention has junction depths less than 50 nm.

SUMMARY OF THE INVENTION

A broad aspect of the present invention is a method of utilizing microwave energy for annealing of ion implanted wafers. By controlling the time, power density and temperature regime, it is possible to substantially fully anneal the wafer while limiting (and substantially preventing) the diffusion of dopant into the silicon, thereby producing higher performance scaled semiconductor devices. It is also possible, using different conditions, to allow and control the dopant profile (diffusion) into the silicon.

A more particular aspect of the present invention is a method of forming a PN junction in a semiconductor wafer having a profile depth less than about 50 nm and a profile wherein the net doping concentration at said PN junction changes by greater than about one order of magnitude over 10 nm wherein the surface concentration of said dopant is greater than about $1 \times 10^{20}/cm^3$. The method includes providing a semiconductor wafer; implanting into said semiconductor surface a dopant; exposing the surface to an energy source; the energy source being applied to supply energy at a rate such that the implanted semiconductor surface is substantially fully annealed before the dopant diffuses greater than about 50 nm.

Another more particular aspect of the present invention is having a PN junction formed between a first material of a first conductivity type and a second material of a second conductivity type, the junction has a depth of less than about 50 nm, in the first material the net doping concentration at the junction changes by greater than about one order of magnitude over 10 nm, the maximum value of said first conducting material of said wafer has a surface concentration of greater than about $1 \times 10^{20}/cm^3$.

DETAILED DESCRIPTION

In our invention, we have discovered a means by which microwave energy can be used to substantially anneal a wafer without causing significant dopant movement—even for a very mobile dopant, such as boron. In addition, our method also enables the activated surface dopant concentration to be above the equilibrium solid solubility of the dopant in the wafer.

Figure 10:
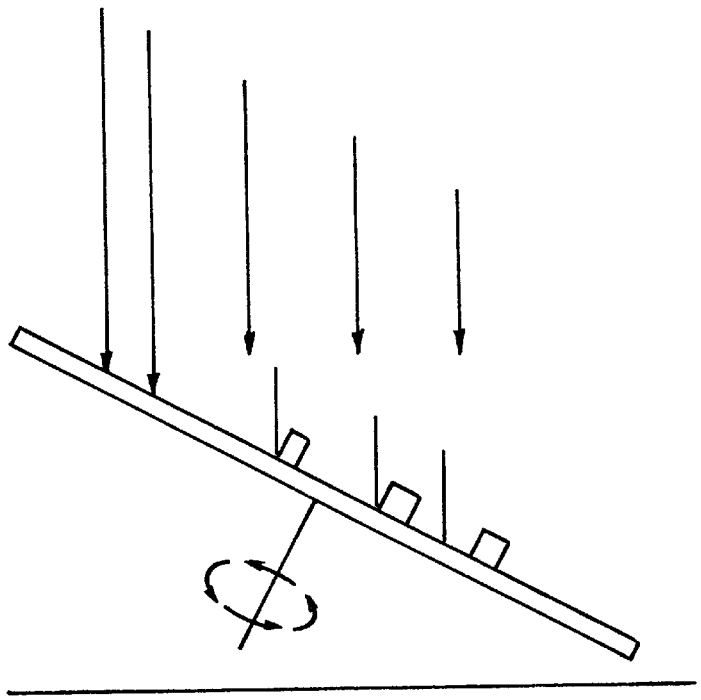
FIG. 10 shows a schematic of a method to obtain overlap of the implanted region under the gate (self-aligning mask) when there is no or minimal dopant diffusion during anneal.
Figure 11A:
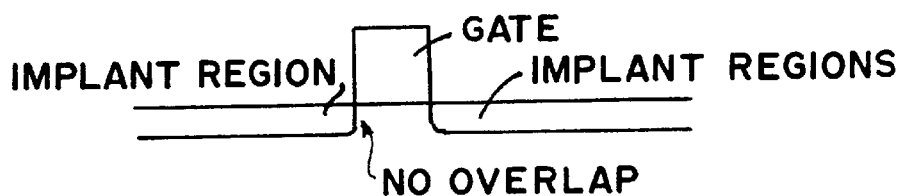
FIG. 11(a) and (b) show the effect of no dopant diffusion on the implanted region. (a) shows the effect of using current implant technology and (b) shows the effect of using the arrangement shown in FIG. 10.
Figure 11B:
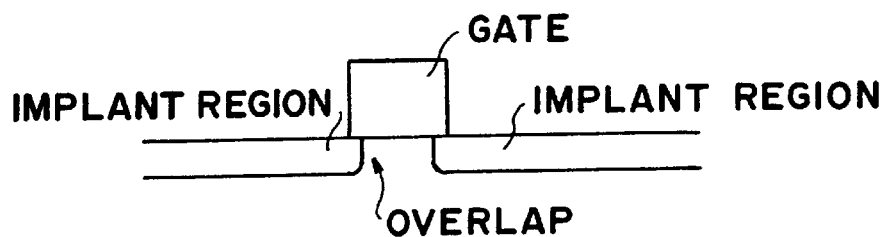

The finding of substantially no dopant motion using our new approach also provides us a new means to tailor the amount of overlap between the Source/Drain extension profile implant and the polysilicon gate of the CMOS device. This can be done by using angle implant with the polysilicon gate as the precision self-align gating mask and the wafer is rotated during ion implantation as shown in FIG. 10. The correct amount of implant overlap with the gap is vital to the performance characteristics of the high speed CMOS devices—currently, the overlap is determined by the lateral diffusion of dopant under the gate with little extrinsic control. If current implant technology is utilized with substantially no lateral dopant diffusion during the anneal process, a profile shown in FIG. 11(a) is obtained. By utilizing the angled implant and wafer rotation (which prevents shadowing) a profile is obtained as shown in FIG. 11(b). By controlling the dopant implant energy using techniques well known in the art, and by controlling the angle of implant relative to the wafer surface, a precision, highly controlled implant region can be obtained.

The dopant implant source can be rotated while the wafer remains fixed for the same result.

The penetration depth of the microwave radiation is strongly dependent on the frequency of the radiation and the loss factor (or conductivity) of the material being exposed. In the case of a good conductor, such as copper for a radiation frequency of about 2.45 GHz, the skin depth, the distance in which the microwave intensity is reduced by 1/e, is about 1 μm. As the frequency increases, the skin depth decreases as $1/\sqrt{\omega}$. Hence use of higher frequencies will result in a stronger decrease in the electric field (i.e. heating closer to the surface) of the wafer. It is difficult to calculate the skin depth for silicon during an annealing process because of the changes in the conductivity which occur during processing and the semi-conducting nature of this material. However, the skin depth will be extremely short at the highest temperatures when the highly doped surface area is fully annealed and activated.

Since silicon has such a high thermal conductivity, thermal energy is quickly transferred throughout the thickness of the wafer. It is desirable to maximize the thermal gradient through the wafer by limiting the temperature of the wafer on the back side and maximize the thermal path through the thickness of the wafer. To control the thermal gradient the wafer is preferably placed on a cold plate whose temperature is controlled. For doped silicon, the resistivity of the un-annealed regions are relatively high before annealing. Hence the silicon wafer can be considered as a heat conductive element throughout the processing. Thus as soon as the sheet resistance of the implanted region begins to drop, the bulk of microwave heat absorption will be confined to the implanted region and the silicon surface temperature rises quickly. Thus by limiting the time in which the silicon surface is at maximum anneal temperature and the large thermal gradient exists through the wafer, the lateral diffusion of the dopant can be minimized, providing the desired shallow and abrupt dopant distribution profile between the doped and the undoped regions of the device. This high temperature, rapid anneal process may have advantages in controlling the leakage current of the devices.

The large thermal gradient prevents rapid diffusion of the dopant and the short process times minimize the lateral diffusion.

Using a microwave flux of about 4–10 $kW/cm^2$ (substantially lower than the reference cited above at 240 $kW/cm^2$), the total microwave power required to anneal an 8" wafer is about 1.3 MW, at 110 GHz for about 50–75 ms. The time duration at which the wafer temperature is above 800 degree where dopants starts to move is much shorter i.e. ≅5 to 10 ms in a total of 50–75 ms microwave pulse-on time.

Although one microwave pulse can be used to substantially anneal the wafer, multiple pulses with a sufficiently long off time to allow cooling of the wafer between pulses, can be used to effectively anneal the wafer at a lower temperature and increase the time at temperature, while maintaining the desired temperature profile through the thickness of the wafer.

In another variation, the wafer is pre-heated to a temperature in the range of 500 to 700° C. by placing the wafer on a conventional hotplate, high power tungsten lamp radiation, etc., and then a single or multiple short pulse of microwave energy is introduced, which raises the temperature of the wafer to a temperature greater than 1000° C. for a short period. The total microwave energy required is substantially less than that if the wafer is heated from room temperature.

Under certain circumstances, defects may be introduced into the wafer - especially at the upper surface which can not be conveniently annealed by the very high temperature, short time regimen. In this case, exposure to microwave energy can substantially anneal the wafer without causing substantial dopant motion and a second, lower temperature anneal technique can be used.

Once dopant atoms are in substitutional positions and the silicon is substantially recrystallized, the rate constant for diffusion is significantly reduced. Hence, further thermal treatment, using microwave energy or other techniques will not result in substantial dopant motion—even though the same treatment without microwave anneal would cause substantial dopant motion.

Experimental

A wafer which has been preamorphized with germanium (bombarded with high energy germanium ions to disrupt the crystalline silicon lattice and make it amorphous) and doped with boron is placed in a sample holder. The microwave radiation with a preset flux density (about 4–10 $kW/cm^2$) and a preset pulse duration is started.

Since microwave radiation in this frequency range behaves quasi-optically, it can be conveniently reflected and the beam traveling through space can be controlled in a similar manner to optical radiation. Ideally, the beam profile of this quasi-optical radiation is a "flat-top" which can be formed from the gaussian beam exiting the generator by specially designed mirrors, similarly to the manner in which beams of light are shaped and is common and known in the art of optics. Additional spreading mirror (beam expanding mirrors), etc., can be added to direct the radiation onto the wafer to be processed.

Figure 1A:
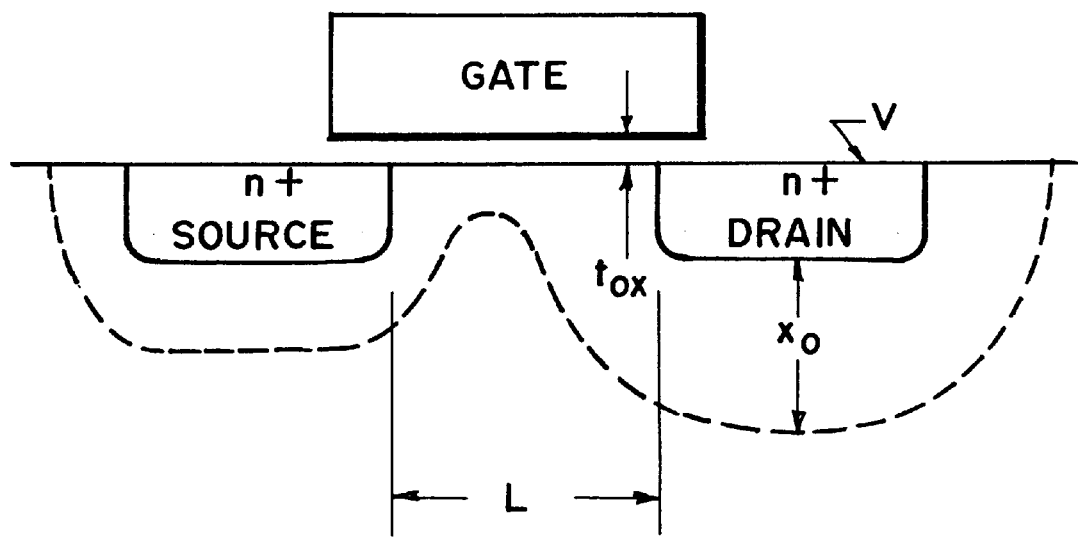
FIG. 1(a) is a schematic diagram of a CMOS device.
Figure 1B:
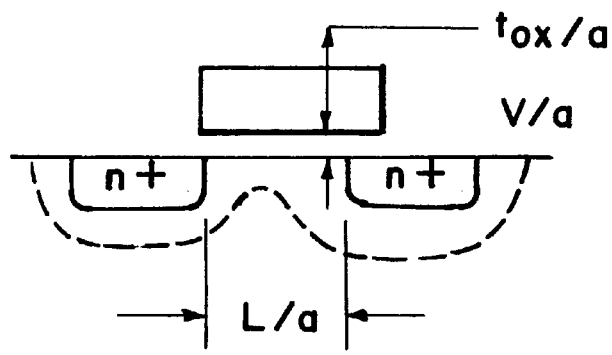
FIG. 1(b) is a schematic diagram of a CMOS device according to the present invention.
Figure 1C:
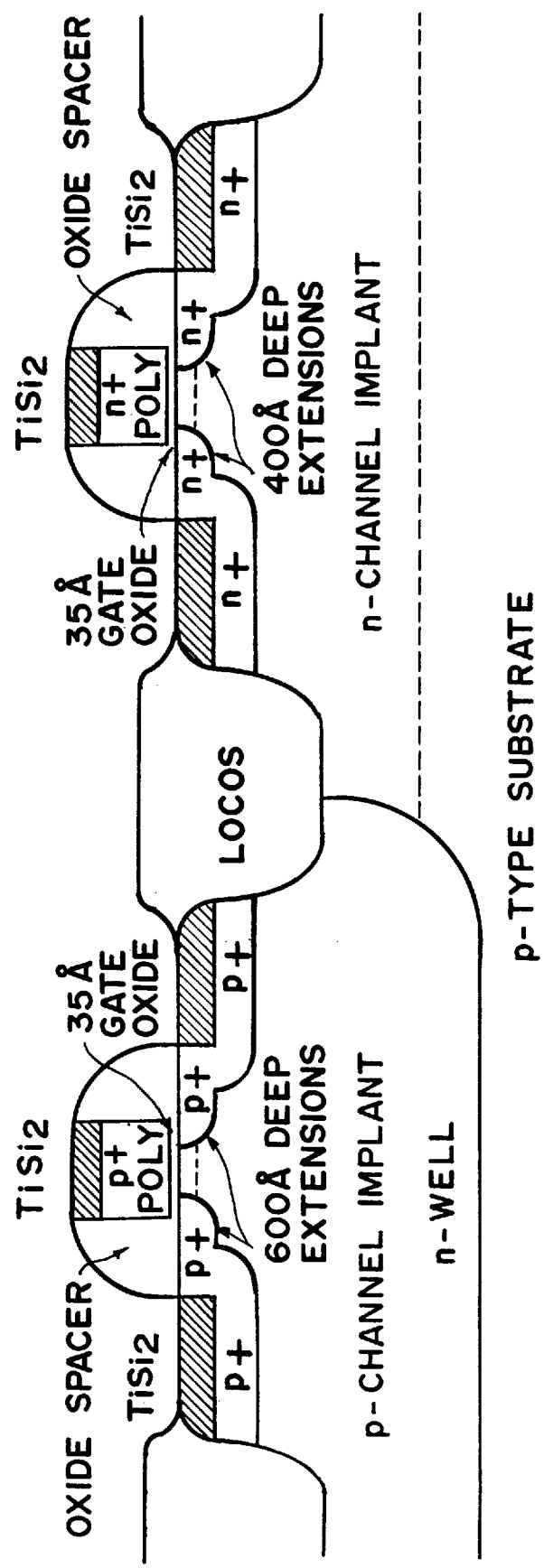
FIG. 1(c) shows a schematic CMOS device corresponding to the device of FIG. 1(a) scaled by the parameter .
Figure 2A:
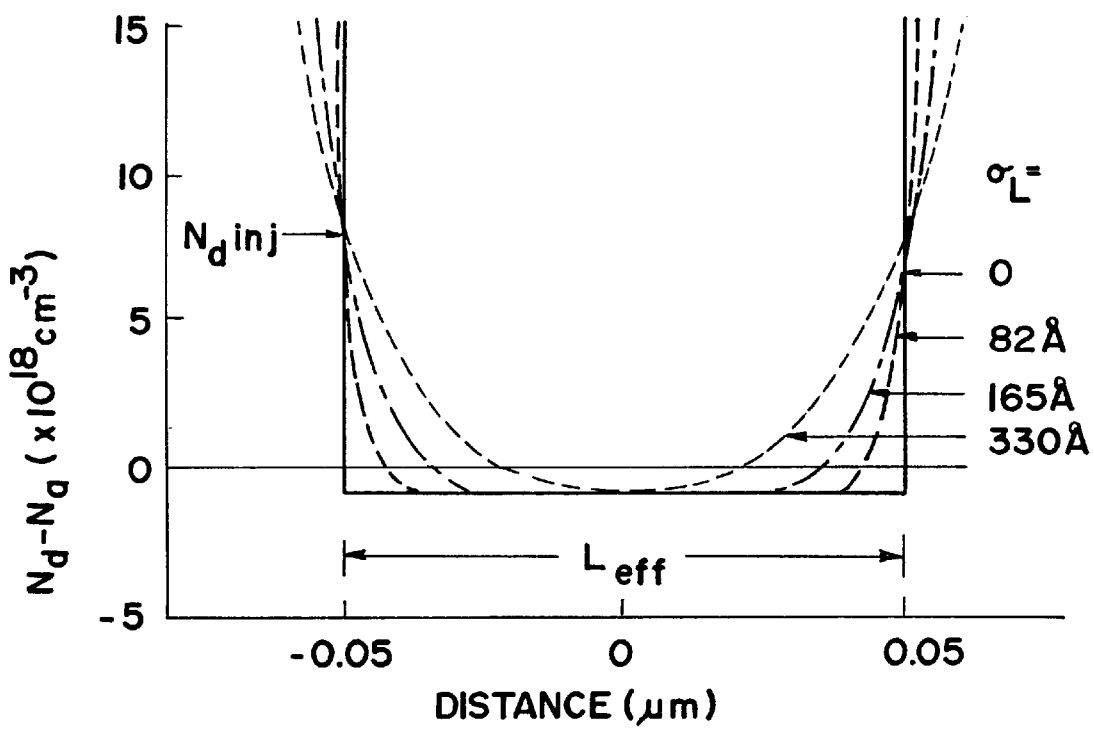
FIG. 2(a) shows plots of various dopant profile vs. distance between source and drain for a CMOS device according to the present invention.
Figure 2B:
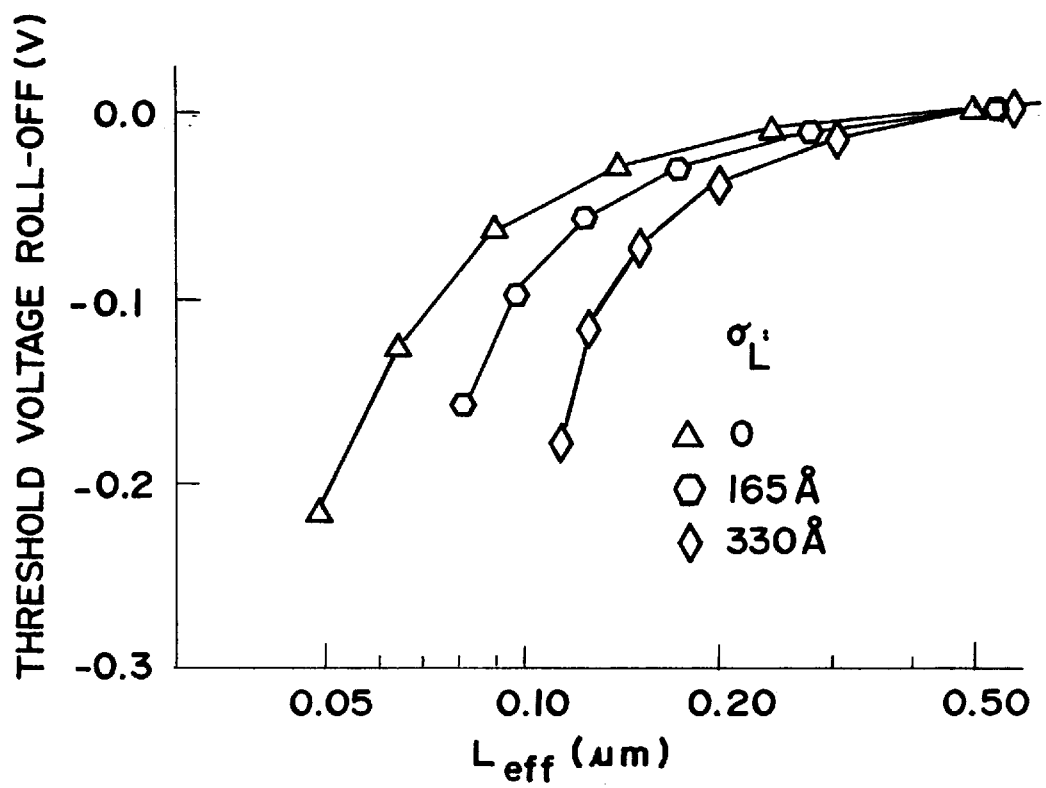
FIG. 2(b) shows various plots of threshold voltage vs. source/drain separation corresponding to the plots of dopant profile of FIG. 2(a).
Figure 3:
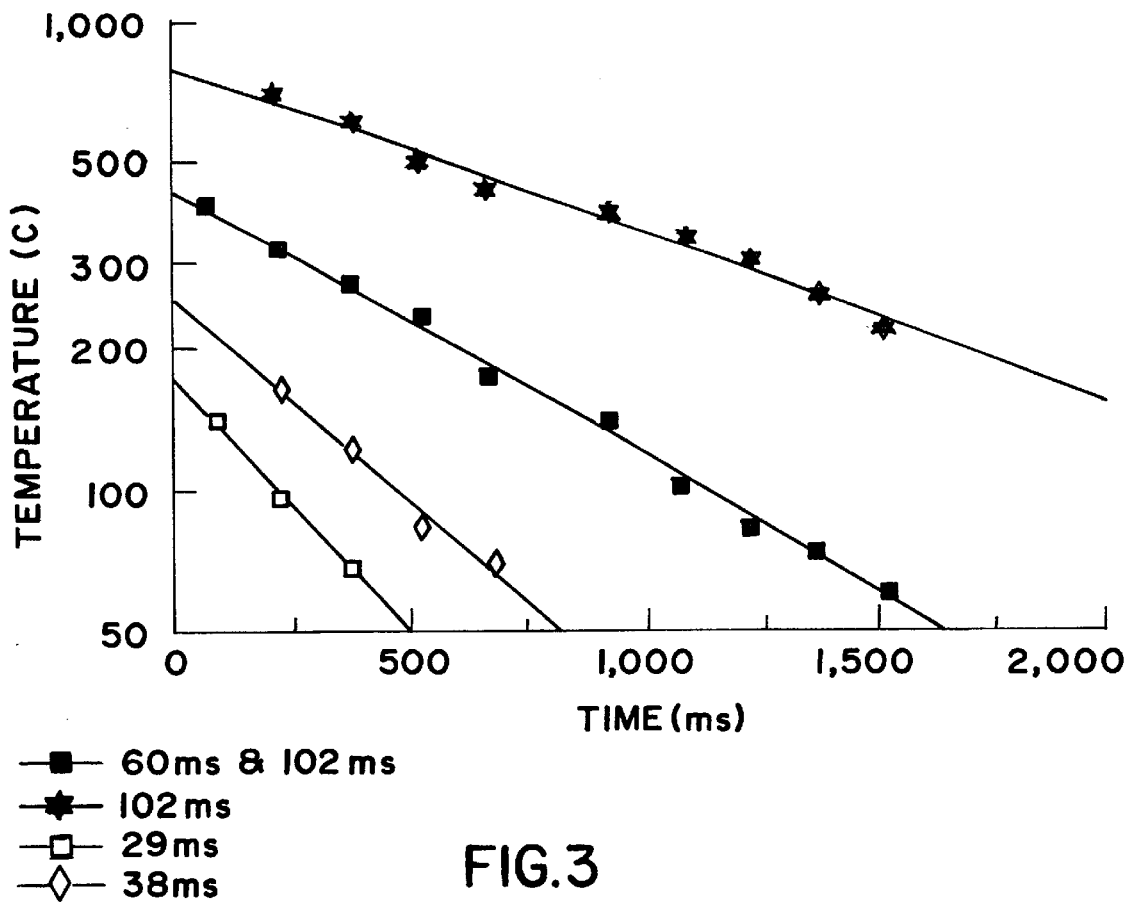
FIG. 3 shows cooling curves for waves exposed to microwave radiation according to the present invention for a series of different irradiation times.
Figure 4:
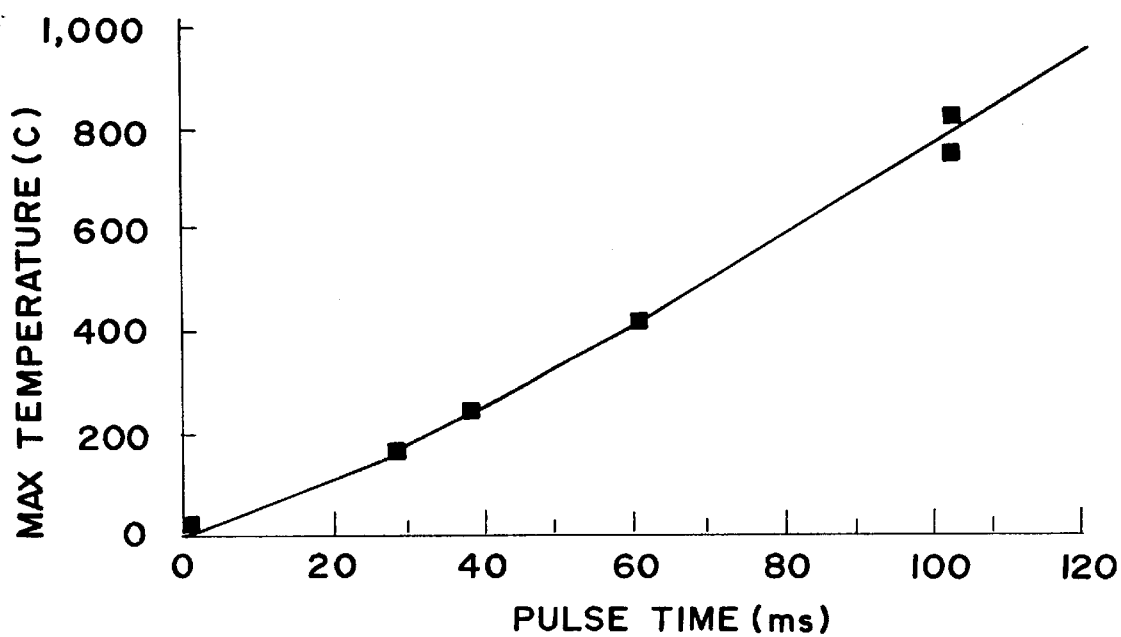
FIG. 4 shows a plot of maximum temperature vs. pulse time.

It is difficult to determine the maximum temperature of the wafer in such a system, since the response time of most IR detectors is less than the time of the exposure. This can be overcome to some extent by measuring the cooling rate of the silicon surface and extrapolating back to the maximum temperature at the end of the microwave exposure. This has been done using an IR camera focused through a mirror and a grid in the microwave waveguide and the results are shown in FIG. 3. This Figure shows the cooling curves for a series of different irradiation times. Following extrapolation, the measured maximum temperatures for different heating time is shown in FIG. 4. This in effect is a heating rate plot, determined from a number of discreet experiments. The indicated temperatures are not the actual temperatures of the top surface, since two additional corrections must be made (i) The emissivity of a silicon wafer is difficult to determine accurately—primarily because it changes, depending on the thickness of the oxide on the surface, the dopant concentration of the wafer, and the temperature of the wafer. (ii) Some IR radiation is not captured by the camera and is lost, due to the mirror in the assembly and the grating through which the IR radiation must pass (the grating stops the microwave radiation leaking out of the waveguide and affecting camera operation). Taking these factors into consideration, the displayed temperature should be increased by between 2.0 and 2.4 to account for these factors and indicate the actual temperature. This indicates that the temperature of the wafers is above 1000° C. From the inspection of the wafer surface under a high resolution optical microscope, there is no indication of surface damage or melting to the wafer. Finally, the dopant profile indicates that the actual temperature did not exceed the melting point of the silicon which is ≅1500° C.

The effectiveness of defect annealing can be evaluated by Transmission Electron Micrograph (hereinafter "TEM") analysis. Raman Scattering analysis is also used to provide a rapid means to determine the crystallinity of the annealed implant over the whole microwave beam incident area. The dopant profile through the thickness of the wafers (as normally occurs) can be monitored by the SIMS (Secondary Ion mass Spectroscopy) analysis of the dopant profile before and after Microwave annealing.

Figure 5:
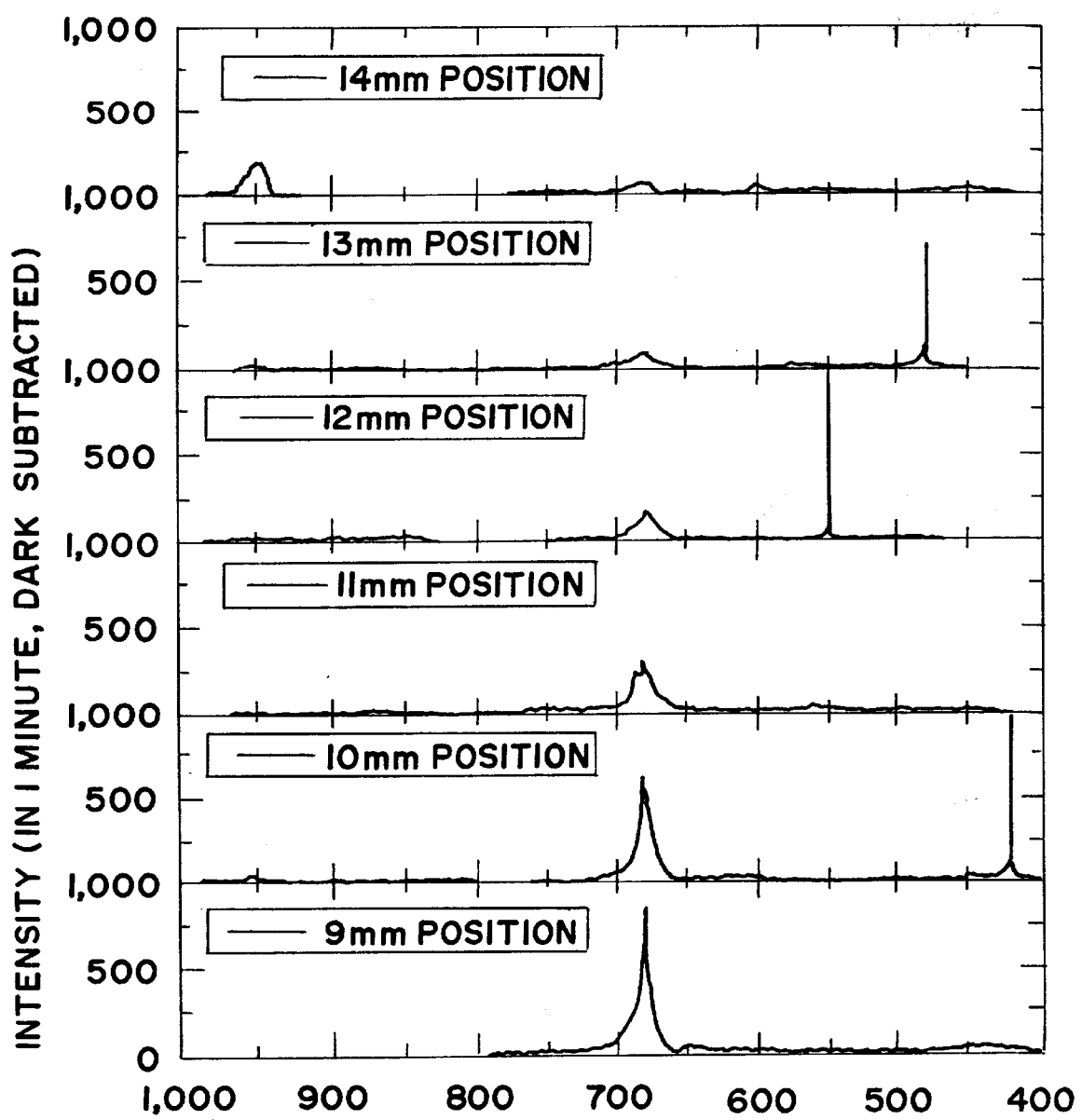
FIG. 5 shows the distribution of the amplitudes of Raman shifts along the diameter of the beam exposure area.
Figure 6:
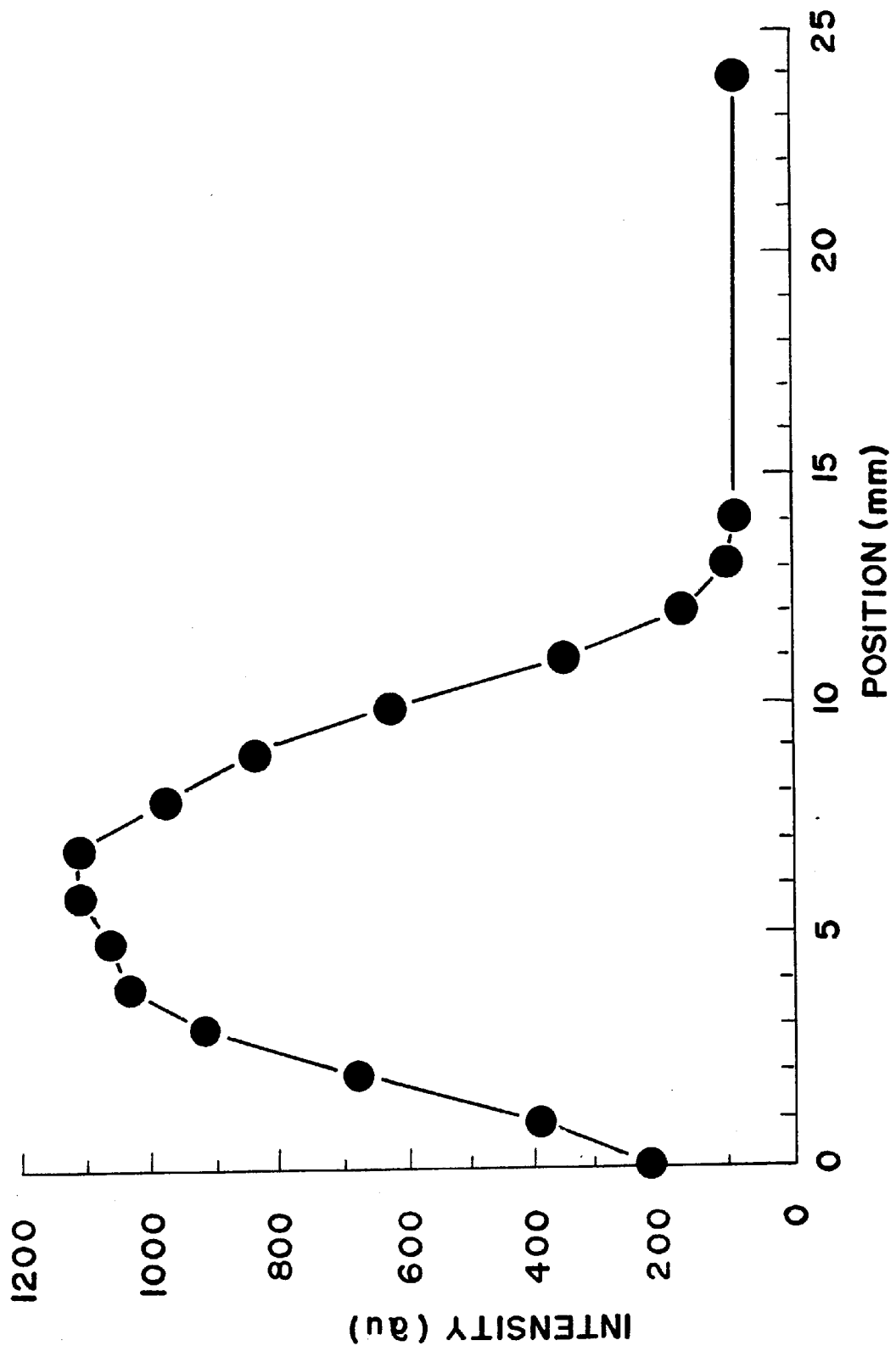
FIG. 6 shows a plot of the amplitude of the Raman shift along the exposed beam regions.
Figure 7A:
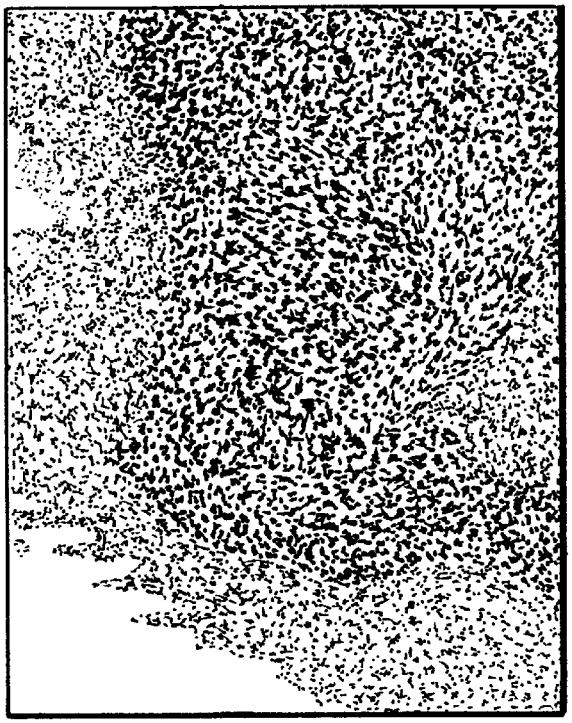
FIG. 7(a) and (b) shows TEM plan view for distances less than 5 mm from the beam center.
Figure 7B:
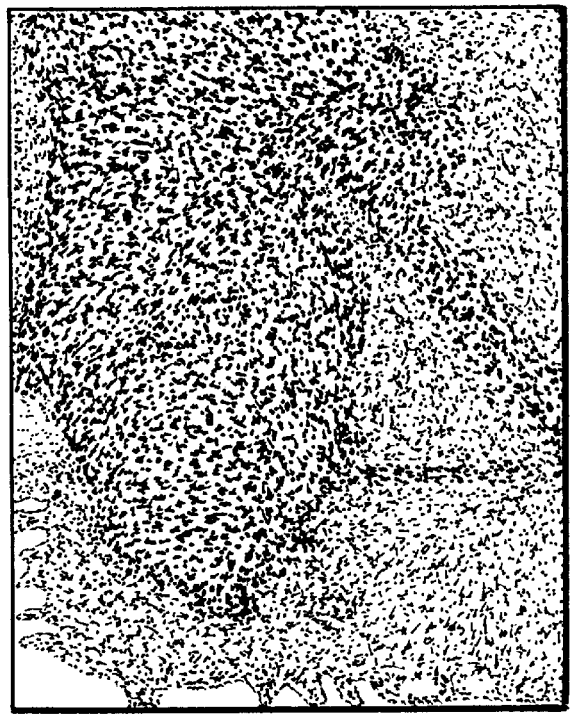

By using a gaussian microwave beam, rather than the preferred (for production) flat-top profile, it is possible to develop a range of flux densities across the wafer and hence a temperature profile across the wafer. After microwave beam exposures, the different annealing states of the implanted regions starting from the center of the beam exposure to the regions outside the beam area were examined by Raman Scattering, TEM and SIMS analyses. FIG. 5 show the distribution of the amplitudes of the Raman shift along the diameter of the beam exposure area. The higher the amplitude of the Raman shift, the better the crystallinity of the exposed region. FIG. 6 shows a plot of the amplitude of the Raman shift along the exposed beam regions. As Shown, the highest crystallinity is obtained close to the beam center and it falls off when it is greater than 5 mm away from the center. FIG. 7(*a*) & (*b*) show the corresponding TEM plan view for distance less than and greater than 5 mm from the beam center. As shown, For distance less than 5 mm, the implanted regions were fully annealed and no defects were observed. However, as the distance is greater than 5 mm from the beam center, clusters of defects are clearly observed indicating the fact that these regions are not fully annealed by the microwave beam heating. These TEM results further reinforce the findings obtained from Raman Scattering analysis.

Figure 8:
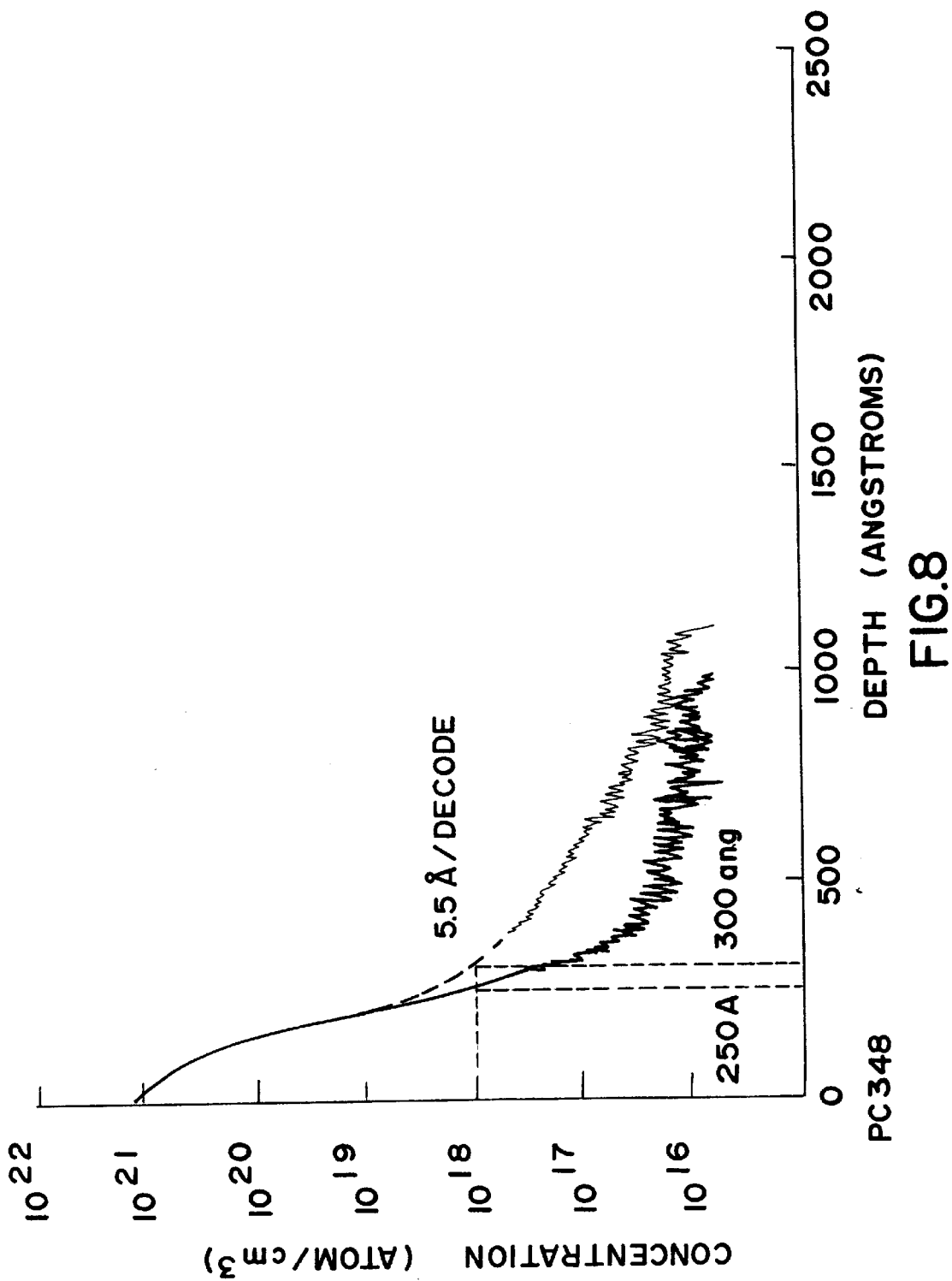
FIG. 8 shows SIMS profiles for different regions of a wafer exposed to microwave radiation according to the present invention.

FIG. 8 shows a series of SIMS profile plots for different regions from the microwave beam exposure center i.e. 0.43 mm, 1.2 mm, 5.9 mm and 24 mm respectively. As can be seen from FIG. 8, the SIMS profiles from the annealed regions (i.e. 0.43 mm, 1.2 mm and 5.9 mm) is similar to the region where there is no microwave exposure. These results indicates the new finding in our new experimental window that there is hardly any dopant motion for microwave annealing of the implanted silicon wafers.

Figure 9:
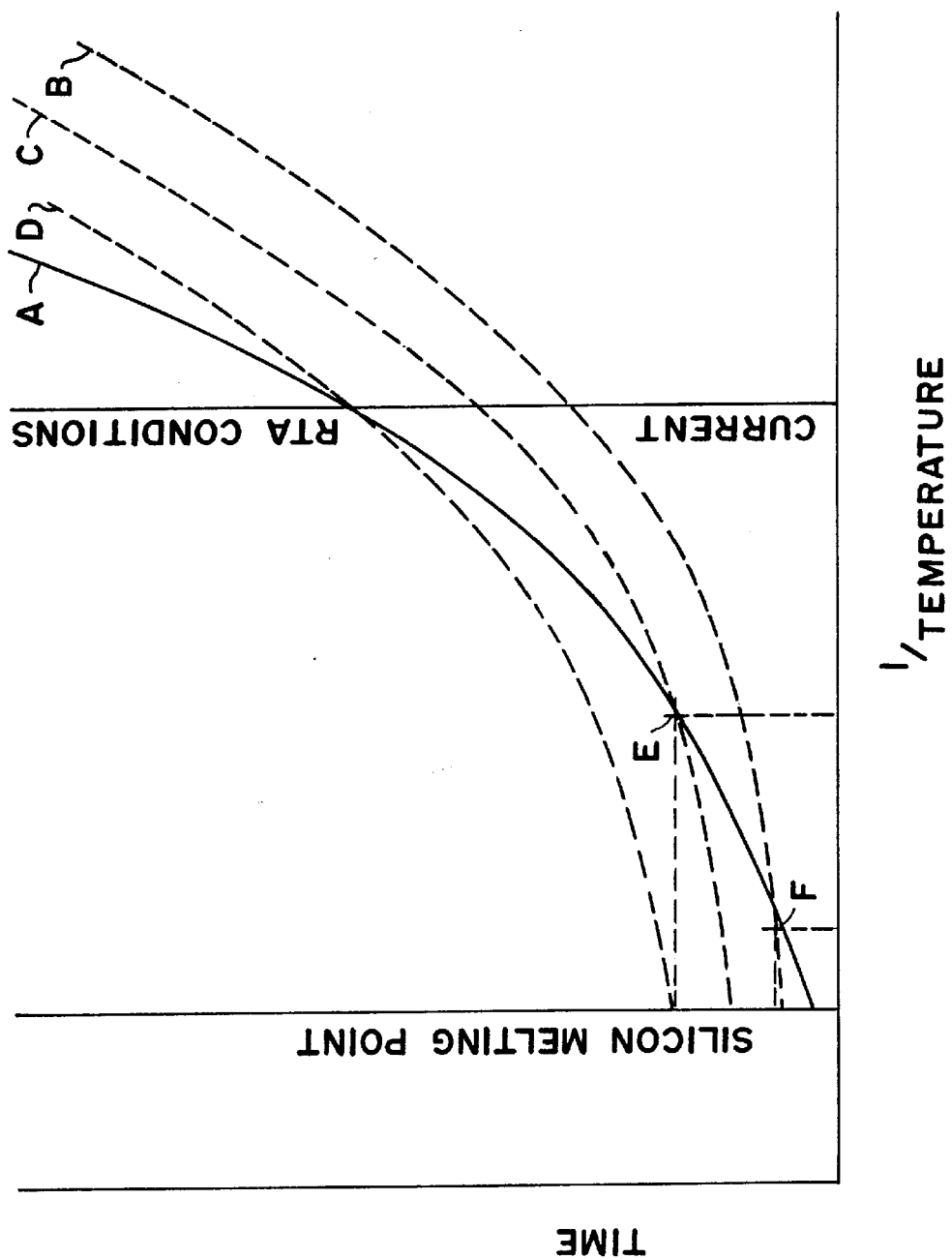
FIG. 9 shows a plot of time to anneal preamorphized silicon vs. 1/T and a series of curves for time to reach diffusion distance of 10 nm, 50 nm, and 100 nm vs. 1/T.

FIG. 9 shows a series of 4 curves of time vs. 1/temperature. Curve A shows the minimum time required to obtain full anneal of a silicon wafer. Curves B, C and D show the times required at each temperature for the dopant to move a certain distance—10 nm (B), 50 nm (C) and 100 nm (D). All of these curves follow the well-known trend that as the process temperature increases the minimum process time decreases. The point E at which curve A intersects with the dopant diffusion endpoint (B for 50 nm max diffusion) indicates the temperature-time combination necessary to provide full anneal and 50 nm dopant diffusion. Similarly, point F corresponds to 10 nm motion and fully anneal. It becomes obvious from this figure that full anneal and 50 nm diffusion can not be obtained using condition to the right of the intersection E.

FIG. 9 also indicates that this phenomenon is not restricted to the utilization of microwave energy. Any energy source which can deposit energy to provide this temperature-time domain can be successful. Other energy sources can include e-beam, IR, UV, etc. or a combination of these with microwave energy. It is desirable to expose the entire wafer in a single shot to prevent the formation of stress cracks adjacent to each pass—the heating rate is high enough to form such defects if a whole wafer exposure is not utilized.

It has been noted that when substantially full anneal has been obtained, the surface of the annealed region takes a blue coloration. This can be removed by a subsequent long, high temperature anneal process.

While the present invention has been described with respect to preferred embodiments, numerous modifications, changes, and improvements will occur to those skilled in the art without departing from the spirit and scope of the invention.

We claim:

1. A method of forming a PN junction in a semiconductor wafer having a dopant profile depth less than about 50 nm and a profile wherein the net doping concentration at said PN junction changes by greater than about one order of magnitude over 10 nm wherein the surface concentration of said dopant is greater than about $1\times10^{20}/cm^3$ comprising: a semiconductor wafer having a surface; implanting into said surface a dopant; exposing said surface to an energy source; said energy source being applied to supply energy at such a rate such that said surface is substantially annealed before said dopant diffuses greater than about 50 nm.

2. A method according to claim 1 wherein said energy source is of microwave radiation.

3. A method according to claim 2 wherein said energy source is microwave radiation said semiconductor wafer is exposed over a period of about 1–200 ms, reaching a temperature of greater than 1000° C. which substantially anneals said wafer and activates said dopant.

4. A method according to claim 1 wherein said activated dopant moves to substitutional locations and becomes electrically active.

5. A method according to claim 1 wherein said dopant has a concentration profile which does not move substantially during said anneal.

6. A method according to claim 2 in which said microwave radiation is in the frequency range of 300 MHz to 500 GHz, preferably around 100 GHz.

7. A method according to claim 5 in which said microwave radiation has a power flux of about 4–10 kW/cm² and an irradiation time of about 1–200 ms.

8. A method according to claim 2 wherein said wafer is preheated to a temperature below 1000° C. prior to exposure to said microwave energy.

9. A method according to claim 2 wherein a back side of said wafer is in contact with a surface to provide a greater thermal gradient through the thickness of said wafer.

10. A method according to claim 6 wherein a back side of said wafer is cooled.

11. A method according to claim 7 wherein said wafer is cooled by contact with a liquid or a gas.

12. A method according to claim 3 in which the frequency is between 30 GHz and 500 GHz, preferably around 100 GHz.

13. A method according to claim 1 in which the wafer is rotated and angled with respect to the incident ion implant.

14. A method according to claim 1 in which said dopant is implanted at a non-orthogonal angle to said wafer which is rotated with respect to said implant angle.

15. A method according to claim 14 wherein both said wafer and said implant angle of said dopant are varied to prevent shadowing.

16. A series of process steps to form a controlled gate-junction overlap, comprising an angled implant with a specific dopant concentration, followed by annealing using suitable microwave energy.

17. A method of partial annealing of a semiconductor, said semiconductor has a lattice, said semiconductor has an implant region containing implant ions, applying microwave energy to substantially move said ions to substitutional positions of said lattice, applying thermal anneal process to remove defects in said lattice.

18. A method according to claim 1 wherein said method is in vacuum.

19. A method according to claim 1 wherein said method is in inert gas.

20. A method according to claim 1 wherein said method is in reactive gas.

21. A method according to claim 1 wherein said method is further including multiple pulses of microwave energy on a sufficiently low duty cycle to allow complete cooling between pulses.

22. A method according to claim 1 wherein said semiconductor substrate is covered with a essentially non-microwave absorbing passivating layer.

23. A method according to claim 1 by which said semiconductor substrate has a surface which takes on a blue appearance.

24. A method according to claim 1 in which both a microwave process and another RTA method are used in conjunction to form the fully annealed and activated doped region.

25. A method according to claim 1 wherein said surface is amorphous.

26. A method according to claim 1 wherein said surface is made amorphous by an ion implant.

* * * * *